United States Patent
Breitbach et al.

Patent Number: 5,757,105
Date of Patent: May 26, 1998

[54] PIVOT DRIVE

[75] Inventors: Elmar Josef Breitbach, Göttingen; Andreas Büter, Braunschweig, both of Germany

[73] Assignee: Deutsche Forschungsanstalt fur Luft-und Raumfahrt e.V., Bonn, Germany

[21] Appl. No.: 734,623

[22] Filed: Oct. 18, 1996

[30] Foreign Application Priority Data

Oct. 20, 1995 [DE] Germany .................. 195 39 201.9

[51] Int. Cl.$^6$ .................................................. H01L 41/08
[52] U.S. Cl. ....................................... 310/328; 310/333
[58] Field of Search ............................ 310/328, 330–333, 310/367, 369, 366

[56] References Cited

U.S. PATENT DOCUMENTS

| | | | |
|---|---|---|---|
| 2,928,069 | 3/1960 | Petermann | 310/369 X |
| 3,035,126 | 5/1962 | Crownover | 310/333 |
| 4,742,261 | 5/1988 | Rich et al. | 310/328 |
| 4,857,791 | 8/1989 | Uchino et al. | 310/323 |
| 4,958,100 | 9/1990 | Crawley et al. | 310/328 |
| 5,396,714 | 3/1995 | Sturges, Jr. et al. | 33/644 |
| 5,424,596 | 6/1995 | Mendenhall et al. | 310/328 |
| 5,455,477 | 10/1995 | Sano et al. | 310/328 |
| 5,594,330 | 1/1997 | Jacobsen | 310/328 |
| 5,626,312 | 5/1997 | Head | 310/328 X |

FOREIGN PATENT DOCUMENTS

| | | |
|---|---|---|
| 36 02 673 A1 | 7/1986 | Germany . |
| Wo 96/01503 | 1/1996 | WIPO . |

OTHER PUBLICATIONS

DGLR-Bericht Jun. 1991: Proceedings from the International forum on Aerolasticity and Structural Dynamics 1991. Essay from "Dünnwandige elastische Stëbe", W.S. Wlassow, 1964.

Dipl.-Inc. Stefan Zurhorst and Prof. Dr.-Ing. Dr. h.c.(H) Huba Ory, Acrive Twist control of a Windtunnel Model Wing, 1991, Germany, 6 pages (double sided).

Primary Examiner—Mark O. Budd
Attorney, Agent, or Firm—Salter & Michaelson

[57] ABSTRACT

A pivot drive for quick and precisely positioned rotational movements around a limited angle value comprises one or more rods with a cross-section which is not warping-free and one or more actuators for the introduction of longitudinal forces into the rods. The longitudinal forces generate warping in the rods so that the rod ends rotate relative to one another. Each rod is constructed in the form of a tube and has a continuous slot arranged in its longitudinal direction.

31 Claims, 1 Drawing Sheet

Fig. 1
Fig. 2
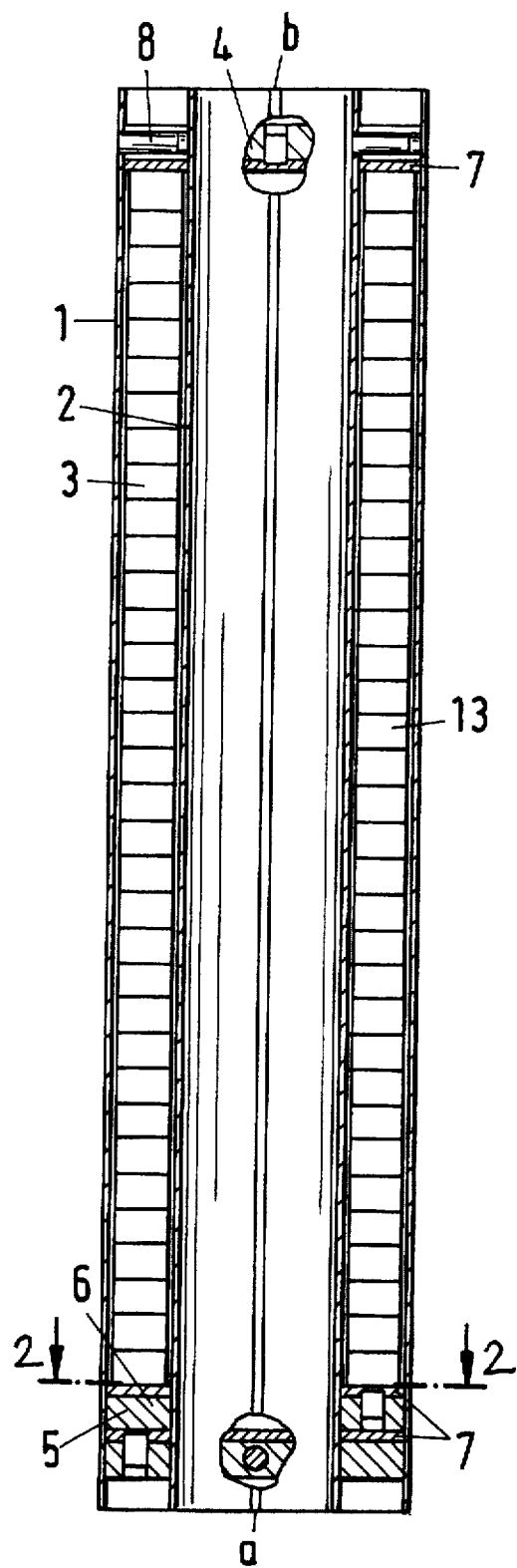
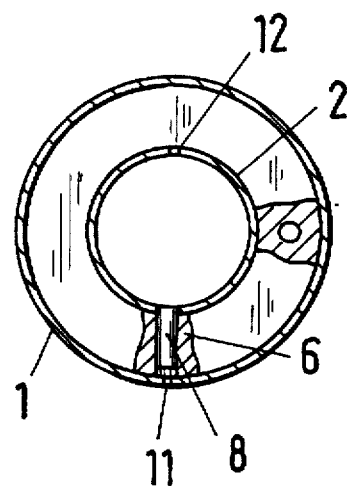

PIVOT DRIVE

BACKGROUND OF THE INVENTION

The invention relates to a pivot drive with a rod and an actuator for passing longitudinal forces into the rod.

In particular the invention relates to a pivot drive for quick and precisely positioned rotational movements by a limited angular amount. The fields of application are, for example, measurement and testing technology, handling technology, air and space travel, robotics and medical engineering.

Pivot drives for the generation of pivoting movements in an angle range of up to 360° are widely known in the prior art. The known pivot drives have hydraulic, pneumatic or electromagnetic control elements. Besides the structural requirements, the economic feasibility of use of a specific configuration of the control element is greatly dependent on the structure of the existing system. Hence, the use of hydraulic or pneumatic drives is only economically feasible, for example, when a hydraulic or pneumatic circuit is already provided in the existing system.

A disadvantage especially in the case of hydraulic pivot drives is that because of its compressibility, the pressurised hydraulic medium exhibits relatively soft behaviour with respect to a steel column. Moreover, the compressibility is increased by the air present in the hydraulic system. A jerky operation results from the presence of air in the hydraulic system. The reversing times are extended overall. In addition, leakage losses and the outlined compressibility result in the hydraulic drive being inadequately interlocking for many applications. Therefore, for precise positioning, additional control and/or regulatory measures must be provided, which will increase production costs and recurring maintenance costs.

The known pneumatic pivot drives exhibit disadvantages similar to hydraulic pivot drives. An additional disadvantage with compressed air drives is that the control drives have relatively large dimensions and there is the risk of ice formation in particular on exhaust outlets. Moreover, it is necessary for the compressed air to be enriched with oil for lubrication of the structural parts, which leads to environmental damage or nuisance as a result of the oil mist contained in the exhaust air, and therefore the pollutants entrained in the air and the condensate must be separated. An additional consideration is increased nuisance as a result of exhaust air noise. Overall, the economic feasibility of pneumatic pivot drives is poor, taking into account the relatively high energy costs.

Stepping motors are used for particularly precise positioning tasks in electromagnetic pivot drives. Contrary to electromotors with motor position indicators, stepping motors are operated in an open control system, as a result of which no feedback is provided as to whether the rotor has indeed reached the predetermined position. It must therefore be ensured that the motor constantly completes the desired number of steps. In particular, stepping motors exhibit starting problems, falling out of step in the case of overload and vibratory behaviour in the case of sudden changes in condition. Therefore, stepping motors are also only conditionally suitable for precise positioning on pivot drives.

A linear motor is known from U.S. Pat. No. 4,857,791. In this, a construction with an H-shaped cross-section is excited to vibrate, in that a vibrator arranged between two arms of the H excites the entire construction to vibrate and each of the two arms remote from the actuator is provided with different resonance frequency. Depending on the vibratory frequency of the vibrator, a forward or backward movement of the entire motor is generated as a result of this.

A piezoelectric operating member is known from German Patent Document DE 36 02 673 A1. Through a system of pivotably or rotatably mounted levers combined with and connected to one another, a force exerted onto one end of one of the levers is converted there into a pivoting movement of another lever mounted around another point of rotation. Interesting reinforcement effects can be achieved as a result of this. The relatively complicated mechanism is primarily based on the amplification effect of levers which are not of equal length, and can have a tendency towards fatigue effects with respect to the sensitive pivot bearing region.

From the article by Zurhorst and Öry: "Active Twist Control of a Windtunnel Model Wing", published in "Proceedings International Forum on Aero-Elasticity and Structural Dynamics", 1991, an application for active twist control is known, in which a four-chord box girder controls the twist on a wind tunnel model wing through discretely introduced warping. The curvature or warping were introduced into the box girder used as a wing torsion box so that the twist generated by external forces, e.g. by an aileron deflection of 20° at an air speed of 67 m/s, is corrected. Undesirable twists of the wing should be controlled with the wing structure which is as rigid as possible. This structural part cannot generate an exact and directly tappable rotational movement.

From scientific papers, e.g. by Wlassow, W. S., "Thin-walled Elastic Rods", vol. 1, VEB Verlag für Bauwesen, Berlin, 1964, torsional warping is known to be an undesirable phenomenon on thin-walled rods. The torsional warping is also deduced mathematically there for open profiles, e.g. such as a slotted circular profile.

SUMMARY OF THE INVENTION

The invention seeks to provide a pivot drive which generates a quick, exact and directly tappable rotational movement, in which the adjustment position is exactly approached in a reproducible manner so that monitoring and control measures on the pivot drive are unnecessary.

This object is achieved in that the rod is constructed with a cross-section, with which an eccentric or off-center introduction of longitudinal force into the rod effects a rotation of the rod ends relative to one another.

Thus, the invention works by utilising the torsional warping which is introduced into the rod by means of an actuator with a cross-section which is not warping-free, i.e. not free of warping.

Warping is a technical term for a specific kind of curving, cambering or arcing. The term is well-known to persons skilled in the art.

With the introduction of bi-moments into a rod capable of warping, the rod ends rotate relative to one another. Consequently, a pivot drive may be created which completes a quick, constant and precisely positioned pivoting movement with maximum torsional rigidity of the rotary element.

If the cross-section of the rod is of open construction, the necessary warping forces applied by the actuator may be kept small. In particular, a rod constructed as a slotted tube is very soft with respect to the desired warping, i.e. a desired torsion angle is formed even with low longitudinal forces generating the curving.

Because several rods are connected in series to increase the achievable angle of rotation, the rods being preferably fitted into one another, the individually achievable angles of rotation are added up so that the installation length of the pivot drive with a predetermined pivoting angle can be kept low. Thus, the pivot drive is constructed in cascade form, the rod elements connected in series being preferably coupled to one another in a suitable fitted or plugged-in construction.

Alternatively, an actuator may be associated with each rod element or with each two rod elements. In the latter case, it is advantageous if two slotted tubes preferably rotated 180° relatively to one another are fitted into one another, whereby an actuator tube generating a longitudinal deformation is arranged between the tubes, in which case the longitudinal deformation is introduced into the tubes by transmission elements. With the introduced bi-moments, the two tubes fitted into one another generate opposed bending moments which substantially cancel one another out, depending on the construction of the tubes. The bending moments arising at the tube during the warping are additionally supported by the actuator tube arranged between the tubes. The rotations of the tube ends occurring relative to one another are introduced and transmitted with the transmission elements. Therefore, the transmission elements are preferably arranged close to the ends of the tubes and constructed in the form of rings, sliding bearings being provided at support points of the rings which are rotatable relative to one another or relative to the actuator tube. The sliding bearings allow the rotations of the rings relative to one another with simultaneous support.

The warping can be introduced without problem through equilibrium force groups at the gap of the slotted tube elements. In this case, the points of application for the longitudinal forces are arranged so that they come to lie on both sides of the slot. However, in order to generate a specific relative rotation, the corresponding warping must be generated via a maximum longitudinal deformation at the points of application. Therefore, to keep the longitudinal deformations to be applied small, it is advantageous for a point of application to be arranged displaced about 90° relative to the slot for introduction of the longitudinal forces generated by the actuator.

It is advantageous in particular with a tubular actuator to cause the desired longitudinal deformation through piezo-ceramic or magnetostrictive elements. Such elements operate without delay and allow a defined longitudinal deformation for precise actuation of the pivot drive. The electrical actuation expenditure necessary for this is low. The actuator tube is preferably constructed from these elements so that the circular ring-shaped cross-section between the two rods constructed in the form of slotted tubes is practically filled. As a result, the tubes are guided and supported by the actuator tube.

BRIEF DESCRIPTION OF THE DRAWINGS

A preferred embodiment of the present invention will now be described with reference to the drawings, of which:

FIG. 1 is a partially sectioned side view of a pivot drive according to the invention, and FIG. 2 shows a cross-section of the pivot drive taken along line A—A shown in FIG. 1.

DESCRIPTION OF THE PREFERRED EMBODIMENT

Referring to the drawings, the pivot drive shown in FIG. 1 has an outer tube 1 and an inner tube 2 with a smaller diameter arranged concentrically thereto. An actuator tube 3 is provided in the circular ring-shaped interstice between the outer tube 1 and the inner tube 2. The actuator tube 3 comprises, for example, circular ring-shaped piezo-ceramic elements 13, which are electrically wired in a suitable manner (not shown). The outer tube 1 has a hollow section, which is constructed open, i.e. by a longitudinal slot 11. Similarly, the inner tube 2 has a slot 12 dividing the tube in longitudinal direction.

On the underside of the tubes 1, 2, the tube end a, the actuator tube 3 is supported on the ends of the tubes via two circular ring-shaped transmission elements 5, 6. At the upper tube end b, a likewise circular ring-shaped transmission element 4 is provided which introduces the longitudinal deformation of the actuator tube 3 into the tubes 1, 2 in the form of warping. The circular ring-shaped transmission element 5 is preferably connected in a rotationally fixed manner by means of a pin 8 to the outer tube 1 at a point of application for the longitudinal force to be introduced. This point of application is preferably the cross-section point (referred to as "contact point") here, at which no warping occurs with a relative rotation of profile. On the upwardly directed circular ring surface of the transmission element 5, a sliding bearing 7 is arranged on which the transmission element 6 arranged thereabove is supported to allow sliding rotation. The transmission element 6 is likewise preferably connected in a rotationally fixed manner by means of a pin 8 to the inner tube 2 at a point of application (contact point of the profile cross-section) for the longitudinal force to be introduced there. A sliding bearing 7 is in turn fastened to the circular ring-shaped surface of the transmission element 6. The actuator tube 3 is supported on this to allow sliding rotational movement.

At the opposite tube end b, the circular ring-shaped transmission element 4 is preferably connected in a rotationally fixed manner to the outer tube 1 and the inner tube 2 respectively by a pin 8. The pin 8 on the outer tube 1 forms the point of application for the longitudinal force to be introduced into the tube 1 in order to generate the warping-ing. The point of application (pin 8) is arranged displaced by 90° relative to the slot 11. Similarly, the pin 8 on the inner tube 2 forms the point of application for the introduction of the longitudinal force causing the warping of the inner tube 2. This point of application (pin 8) is also arranged displaced by 90° relative to the slot 12. As a result of the point of application for the longitudinal force being displaced by the angle value of 90° relative to the slot 11 or 12, only a relatively small longitudinal deformation is necessary to generate a predetermined angle of rotation and thus a corresponding warping. The maximum longitudinal deformation occurring at slot 11 or 12 does not therefore have to be generated by the actuator tube 3. A sliding bearing 7, on which the upper side of the actuator tube 3 is supported to allow sliding rotation, is also arranged on the circular ring-shaped underside of the transmission element 4.

The method of operation of the actuator is described in detail below.

A longitudinal deformation is generated by the actuator tube 3, said longitudinal deformation being transmitted to the tubes 1, 2 via the sliding bearing 7 and the transmission elements 4, 5 and 6 as well as the pins 8 fastened there. Since the tubes 1, 2 have longitudinal slots 11, 12 and the introduction of force is not warping-free, warping of the tubes 1, 2 occurs. Warping is generated in the outer tube 1 by the actuator tube 3 supported on the tube end a through the introduction of force, so that the upper tube end b of the outer tube 1 is rotated.

The upper tube end b of the inner tube 2 is rotated through this corresponding angle of rotation via the transmission element 4. However, the change in length generated by the actuator tube also acts on the inner tube as a result of the support arrangements so that warping in the inner tube 2 occurs in addition to the angle of twist of the outer tube 1. Therefore, the lower tube end a of the inner tube rotates by a further angular amount. Thus overall, an amount of pivoting movement, which is proportional to the force introduced by the actuator tube 3, may be tapped at the lower tube end a between the outer tube 1 and the inner tube 2.

Consequently, this pivot drive allows very precise pivoting movements to be actuated. It is possible to control a precisely predetermined value of angle of rotation with the pivot drive. Thus, a very precise rotation is possible through introduction of relatively low force. Because of the actuator tube arranged between the outer and the inner tube, the device is non-sensitive to warping and thus rigid to torsion in spite of the slotted arrangement. The slotted tubes behave distinctly softly only for the intentionally introduced, and thus allowable, warping.

Cascading, i.e. an addition of the achievable angle of rotation, may be generated as a result of a multiple fitted assembly of such arrangements. Therefore, it is also possible to reduce the structural length of the pivot drive in the case of a predetermined angle of rotation.

It will be understood that the above description of the present invention is susceptible to various modifications, changes and adaptations.

What is claimed is:

1. A pivot drive comprising:
    a cylindrical tube having a continuous longitudinal slot which extends parallel to an axis of tube, said slot permitting torsional warp rotation of opposite ends of said tube when a longitudinal force is applied to a predetermined actuator point on said tube; and
    means for selectively applying a longitudinal force to said predetermined actuator point on said tube whereby the opposite ends of said tube are rotated relative to each other.

2. The pivot drive of claim 1 wherein said predetermined actuator point is circumferentially spaced from said slot by about 90°.

3. The pivot drive of claim 1 wherein said tube is provided with pre-tensioned warp.

4. The pivot drive of claim 2 wherein said tube is provided with pre-tensioned warp.

5. The pivot drive of claim 1 wherein said means for selectively applying a longitudinal force comprises an expandable actuator element enclosed within said tube.

6. The pivot drive of claim 2 wherein said means for selectively applying a longitudinal force comprises an expandable actuator element enclosed within said tube.

7. The pivot drive of claim 3 wherein said means for selectively applying a longitudinal force comprises an expandable actuator element enclosed within said tube.

8. The pivot drive of claim 4 wherein said means for selectively applying a longitudinal force comprises an expandable actuator element enclosed within said tube.

9. The pivot drive of claim 5 wherein said expandable actuator element is selected from the group consisting of: a piezo-ceramic actuator, and a magneto-restrictive actuator.

10. The pivot drive of claim 6 wherein said expandable actuator element is selected from the group consisting of: a piezo-ceramic actuator, and a magneto-restrictive actuator.

11. The pivot drive of claim 7 wherein said expandable actuator element is selected from the group consisting of: a piezo-ceramic actuator, and a magneto-restrictive actuator.

12. The pivot drive of claim 8 wherein said expandable actuator element is selected from the group consisting of: a piezo-ceramic actuator, and a magneto-restrictive actuator.

13. The pivot drive of claim 1 wherein a plurality of said tubes are connected end to end in series to increase an achievable angle of rotation.

14. The pivot drive of claim 13 wherein each of said plurality of tubes includes a respective means for applying a longitudinal force to the predetermined actuator point thereon.

15. A pivot drive comprising:
    an outer tube having a continuous longitudinal slot which extends parallel to an axis of outer tube, said slot permitting torsional warp rotation of opposite ends of said outer tube when longitudinal forces are applied to predetermined actuator points adjacent said opposite ends of said outer tube;
    an inner tube arranged concentrically within the outer tube, said inner tube having a continuous longitudinal slot which extends parallel to an axis of inner tube, said slot permitting torsional warp rotation of opposite ends of said inner tube when longitudinal forces are applied to predetermined actuator points adjacent said opposite ends of said inner tube; and
    a longitudinally deformable actuator element arranged between said inner and outer tubes, said actuator element being connected to said predetermined actuator points on said inner and outer tubes, said opposite ends of said inner and outer tubes being rotated relative to each other upon a longitudinal deformation of said actuator element.

16. The pivot drive of claim 15 wherein said longitudinal slot in said inner tube is offset from said longitudinal slot in said outer tube by 180° of rotation.

17. The pivot drive of claim 15 wherein said predetermined actuator points on said inner and outer tubes are circumferentially spaced from said respective longitudinal slots by 90°.

18. The pivot drive of claim 16 wherein said predetermined actuator points on said inner and outer tubes are circumferentially spaced from said respective longitudinal slots by 90°.

19. The pivot drive of claim 15 wherein at least one of said inner and outer tubes is provided with pre-tensioned warp.

20. The pivot drive of claim 15 wherein said actuator element is longitudinally expandable between a normal condition having a first length and an expanded condition having a second greater length whereby an outwardly directed longitudinal force is applied to said predetermined actuator points.

21. The pivot drive of claim 16 wherein said actuator element is longitudinally expandable between a normal condition having a first length and an expanded condition having a second greater length whereby an outwardly directed longitudinal force is applied to said predetermined actuator points.

22. The pivot drive of claim 17 wherein said actuator element is longitudinally expandable between a normal condition having a first length and an expanded condition having a second greater length whereby an outwardly directed longitudinal force is applied to said predetermined actuator points.

23. The pivot drive of claim 18 wherein said actuator element is longitudinally expandable between a normal condition having a first length and an expanded condition having a second greater length whereby an outwardly directed longitudinal force is applied to said predetermined actuator points.

24. The pivot drive of claim 19 wherein said actuator element is longitudinally expandable between a normal condition having a first length and an expanded condition having a second greater length whereby an outwardly directed longitudinal force is applied to said predetermined actuator points.

25. The pivot drive of claim 15 wherein said actuator element comprises a longitudinally expandable tube formed by a plurality of stacked rings disposed between said inner and outer tubes, said rings being fabricated from a material selected from the group consisting of: piezo-ceramic, magneto-restrictive, and combinations thereof.

26. The pivot drive of claim 16 wherein said actuator element comprises a longitudinally expandable tube formed by a plurality of stacked rings disposed between said inner and outer tubes, said rings being fabricated from a material selected from the group consisting of: piezo-ceramic, magneto-restrictive, and combinations thereof.

27. The pivot drive of claim 17 wherein said actuator element comprises a longitudinally expandable tube formed by a plurality of stacked rings disposed between said inner and outer tubes, said rings being fabricated from a material selected from thie group consisting of: piezo-ceramic, magneto-restrictive, and combinations thereof.

28. The pivot drive of claim 18 wherein said actuator element comprises a longitudinally expandable tube formed by a plurality of stacked rings disposed between said inner and outer tubes, said rings being fabricated from a material selected from the group consisting of: piezo-ceramnic, magneto-restrictive, and combinations thereof.

29. The pivot drive of claim 19 wherein said actuator element comprises a longitudinally expandable tube formed by a plurality of stacked rings disposed between said inner and outer tubes, said rings being fabricated from a material selected from the group consisting of: piezo-ceramic, magneto-restrictive, and combinations thereof.

30. The pivot drive of claim 15 wherein a plurality of tube arrangements are connected end to end in series to increase an achievable angle of rotation.

31. The pivot drive of claim 30 wherein each of said plurality of tube arrangements includes a respective means for applying a longitudinal force to the predetermined actuator point thereon.

* * * * *